(12) United States Patent
Ventzek et al.

(10) Patent No.: US 12,131,888 B2
(45) Date of Patent: Oct. 29, 2024

(54) GAS CLUSTER ASSISTED PLASMA PROCESSING

(71) Applicant: Tokyo Electron Limited, Tokyo (JP)

(72) Inventors: Peter Ventzek, Austin, TX (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 710 days.

(21) Appl. No.: 17/008,314

(22) Filed: Aug. 31, 2020

(65) Prior Publication Data
US 2022/0068607 A1 Mar. 3, 2022

(51) Int. Cl.
| H01J 37/32 | (2006.01) |
| H01L 21/3065 | (2006.01) |
| H01L 21/311 | (2006.01) |
| H01L 21/67 | (2006.01) |

(52) U.S. Cl.
CPC .. *H01J 37/32449* (2013.01); *H01J 37/32091* (2013.01); *H01J 37/321* (2013.01); *H01J 37/3244* (2013.01); *H01L 21/3065* (2013.01); *H01L 21/31116* (2013.01); *H01L 21/31144* (2013.01); *H01L 21/67069* (2013.01); *H01J 2237/334* (2013.01)

(58) Field of Classification Search
CPC .......... H01J 37/32449; H01J 2237/334; H01J 37/32091; H01J 37/3244; H01J 37/321; H01L 21/3065; H01L 21/67069; H01L 21/31116; H01L 21/31144
See application file for complete search history.

(56) References Cited

U.S. PATENT DOCUMENTS

| 5,539,440 | A | * | 7/1996 | Higuchi | ................. G03G 15/34 347/171 |
| 6,162,323 | A | * | 12/2000 | Koshimizu | ....... H01L 21/67017 118/723 R |
| 6,620,289 | B1 | * | 9/2003 | Yan | ........................ C23C 16/455 118/723 R |

(Continued)

FOREIGN PATENT DOCUMENTS

| JP | 4855506 B2 | 1/2012 | |
| JP | 2018026532 A | * 2/2018 | ............. C23C 16/02 |
| WO | 2016111811 A1 | 7/2016 | |

OTHER PUBLICATIONS

Aladi, Mark, et al., "Cluster size distributions in gas jets for different nozzle geometries," Journal of Instrumentation, Jun. 20, 2017, 7 pages.

(Continued)

*Primary Examiner* — Jeffrie R Lund
(74) *Attorney, Agent, or Firm* — Slater Matsil, LLP

(57) ABSTRACT

A method for processing a substrate includes forming a patterned layer over the substrate, the layer including an opening, where a surface of the opening includes a sidewall and a bottom wall. The method includes processing the patterned layer with an anisotropic process by generating a flux of gas clusters over the substrate in a first process chamber, where the gas clusters include radical precursors; exposing the substrate to the flux of gas clusters. The method includes sustaining plasma including ions in a second process chamber; and exposing the substrate to the ions by directing the ions toward the bottom wall of the opening.

21 Claims, 10 Drawing Sheets

(56) References Cited

U.S. PATENT DOCUMENTS

| | | | |
|---|---|---|---|
| 6,812,147 B2 | 11/2004 | Skinner et al. | |
| 6,833,052 B2 * | 12/2004 | Li | C23C 16/45512 |
| | | | 156/345.33 |
| 8,372,200 B2 * | 2/2013 | Okesaku | H01J 37/3244 |
| | | | 156/345.33 |
| 9,735,019 B2 | 8/2017 | Graf et al. | |
| 2017/0283948 A1 | 10/2017 | Chiu et al. | |
| 2018/0163305 A1 | 6/2018 | Batzer et al. | |
| 2018/0174870 A1 | 6/2018 | Yang et al. | |
| 2019/0376183 A1 | 12/2019 | Shanbhag et al. | |
| 2022/0068607 A1 * | 3/2022 | Ventzek | H01J 37/3244 |
| 2023/0332291 A1 * | 10/2023 | Varadarajan | H01J 37/32357 |

OTHER PUBLICATIONS

International Search Report and Written Opinion, International Application No. PCT/US2021/046738, dated Dec. 9, 2021, 10 pages.

International Preliminary Report, International Application No. PCT/US2021/046738, dated Mar. 9, 2023, 6 pages.

\* cited by examiner

GAS CLUSTER ASSISTED PLASMA PROCESSING

TECHNICAL FIELD

The present invention relates generally to plasma processing, and, in particular embodiments, to a system and method for gas cluster assisted plasma processing.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the deposition and etch steps used to form the constituent structures of semiconductor devices are performed using plasma processes. Plasma processing techniques include chemical dry etching (CDE) (e.g., plasma ashing), physical or sputter etching, reactive ion etching (RIE), plasma-enhanced CVD (PECVD), plasma-enhanced atomic layer etch (PEALE), and atomic layer deposition (PEALD).

At each successive technology node, the minimum feature sizes are shrunk to reduce cost by roughly doubling the component packing density. The demand for low cost electronics with high functionality has driven feature sizes down to a few nanometers. With lateral dimensions approaching the scale of molecules and atoms, plasma technology faces the challenge of fabricating very high aspect ratio structures with processes that can also meet the stringent precision, uniformity, stability, and repeatability required for IC manufacturing. Further innovations in plasma processing systems and methods may have to be made to overcome the hurdles in the path of successful semiconductor device manufacturing.

SUMMARY

In accordance with an embodiment, a method for processing a substrate includes forming a patterned layer over the substrate, the layer including an opening, where a surface of the opening includes a sidewall and a bottom wall. The method includes processing the patterned layer with an anisotropic process by generating a flux of gas clusters over the substrate in a first process chamber, where the gas clusters include radical precursors; exposing the substrate to the flux of gas clusters. The method includes sustaining plasma including ions in a second process chamber; and exposing the substrate to the ions by directing the ions toward the bottom wall of the opening.

In accordance with an embodiment, a system for processing a substrate includes a first subsystem including: a plenum including a gas inlet; a nozzle assembly including a plurality of nozzles, where an intake aperture of each of the plurality of nozzles is disposed inside the plenum; and a gas cluster process chamber connected to the plenum through the plurality of nozzles of the nozzle assembly; and a gas flow system connected to the gas inlet and a gas outlet of the gas cluster process chamber, where the gas flow system is configured to generate a flux of gas clusters in the gas cluster process chamber. The system includes a second subsystem including a plasma process chamber, and a power source for powering a plasma in the plasma process chamber.

In accordance with an embodiment, a system for processing a substrate includes a plenum; a substrate processing chamber disposed outside the plenum and configured to sustain a plasma; a nozzle having an intake aperture coupled to the plenum and an exit aperture coupled to the substrate processing chamber.

BRIEF DESCRIPTION OF THE DRAWINGS

For a more complete understanding of the present invention, and the advantages thereof, reference is now made to the following descriptions taken in conjunction with the accompanying drawings, in which:

FIG. 7A illustrates a top planar view of a nozzle system with embedded electrodes for a system for processing a substrate with a gas cluster assisted anisotropic plasma process, in accordance with an embodiment;

FIG. 7B illustrates a bottom planar view of a nozzle system with embedded electrodes for a system for processing a substrate with a gas cluster assisted anisotropic plasma process, in accordance with an embodiment;

FIGS. 7C-7D illustrate cross-sectional views of a nozzle system with embedded electrodes for a system for processing a substrate with a gas cluster assisted anisotropic plasma process, in accordance with an embodiment;

DETAILED DESCRIPTION OF ILLUSTRATIVE EMBODIMENTS

Figure 1A:
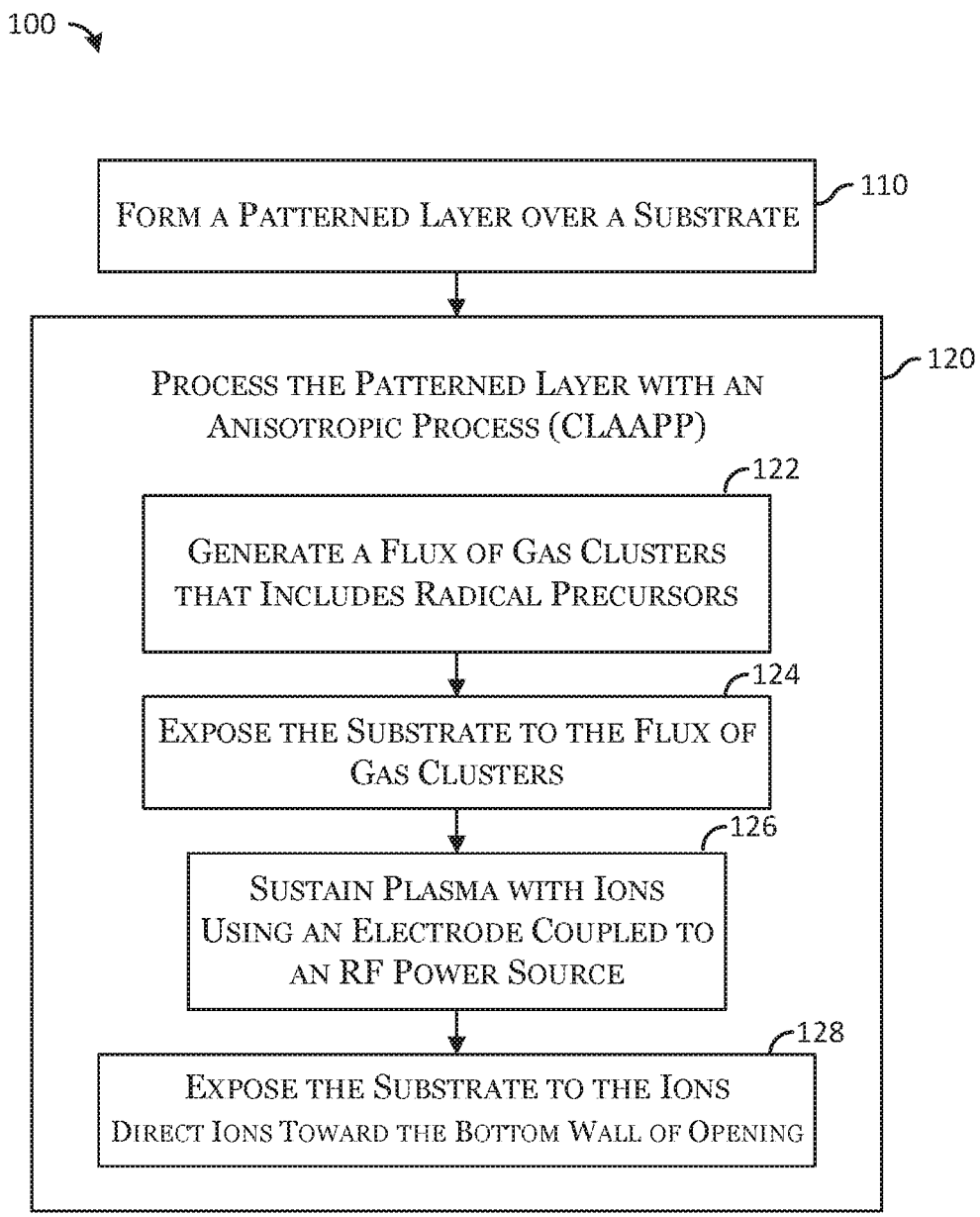
FIG. 1A is a flow diagram of a method for processing a substrate with a gas cluster assisted anisotropic plasma process, in accordance with an embodiment.

This disclosure describes processing a substrate with gas cluster assisted anisotropic plasma processes. The gas cluster assisted anisotropic plasma processing technique, described herein in various embodiments, is a hybrid gas cluster and plasma processing method. In various embodiments of this method, radicals are delivered by a flux of gas clusters close to an etch surface, and positively charged ions from plasma is directed toward the substrate to remove material from the etch surface.

Generally, the velocity of neutral radicals in anisotropic plasma etch processes has a wide angular distribution, whereas positively charged ions can be more easily directed, for example, directed normal to the substrate by a vertical electric field to form a vertical hole or trench. Thus, a radical entering the cavity of a narrow opening is more likely to collide with the sidewalls and get adsorbed there relative to an ion entering the cavity with a near vertical velocity. This phenomenon causes the radical to ion ratio to drop rapidly with the depth of the cavity and may even limit the maximum aspect ratio achievable by the respective etch process.

Highly anisotropic plasma etch processes often utilize a passivating layer adsorbed along the vertical sidewall while bombarding the bottom wall with a highly directed flux of ions in order to promote anisotropy and control the sidewall profile. Anisotropic chemical plasma etch processes involve a combination of adsorption and desorption fluxes with a net removal of substrate material as volatile gaseous reaction byproducts. These fluxes are understood to be simultaneously occurring in a reaction volume of a few monolayers of the surface, referred to as a mixed-layer. The removal rate reduces with increasing thickness of the mixed-layer and, as mentioned above for the vertical sidewall, the removal process may even stop in the absence of a flux of energetic ions. Energetic ions, directed towards the substrate, may be construed as being implanted in the mixed-layer at the bottom wall with sufficient energy to facilitate chemical reactions between the substrate and the etch reactants, for example, by breaking chemical bonds. It is desirable for controlled anisotropic plasma etch processes to achieve a condition where the removal rate is directly proportional to the flux of incident ions. This condition is roughly attained when $\Gamma_r/\Gamma_i \gg 1$, where $\Gamma_r$ denotes the radical flux and $\Gamma_i$ denotes the ion flux. The fluorine-based etch chemistries may not be manufacturable if the $\Gamma_r/\Gamma_i$ ratio is too low, for example, $\Gamma_r/\Gamma_i$ falls below 10. Radicals are also utilized as a scavenger species to form volatile gaseous byproducts that have enough vapor pressure to be pumped away by the vacuum system. For example, in an RIE step using carbon tetrafluoride ($CF_4$) to etch silicon, carbon residue from the dissociation of $CF_4$ may be scavenged by adding a small amount of oxygen. Oxygen radicals react with carbon to form volatile gaseous oxides of carbon (e.g., $CO$ and $CO_2$). As explained above, it is difficult to inject a sufficient supply of radicals through a top opening of a narrow and deep hole, for example, a via 30 nm in diameter and 3 microns deep, and achieve a large value of $\Gamma_r/\Gamma_i$ close to the etching surface at the bottom.

The systems and methods described in this disclosure provide the advantage of an increased density of radicals deep inside a high aspect ratio cavity. Accordingly, a target application that may use the gas cluster assisted anisotropic plasma processing technique to advantage is etching high aspect ratio openings in semiconductor device structures such as contacts, vias, and trench capacitors for dynamic random access memory (DRAM) cells. In this disclosure, the gas Cluster Assisted Anisotropic Plasma Processing (CLAAPP) technique, referred to as CLAAPP, has been explained in the context of patterning a layer to form narrow openings with medium aspect ratio (e.g., aspect ratio of about 30 to about 60) using a conventional anisotropic plasma technique (e.g., RIE) and then extending the depth to form ultra-high aspect ratio features using the CLAAPP technique. For example, the maximum aspect ratio $(AR)_{max}$ may be increased from about 60 to about 100 and even 150 by using the embodiments of CLAAPP described in this disclosure.

Figure 1B:
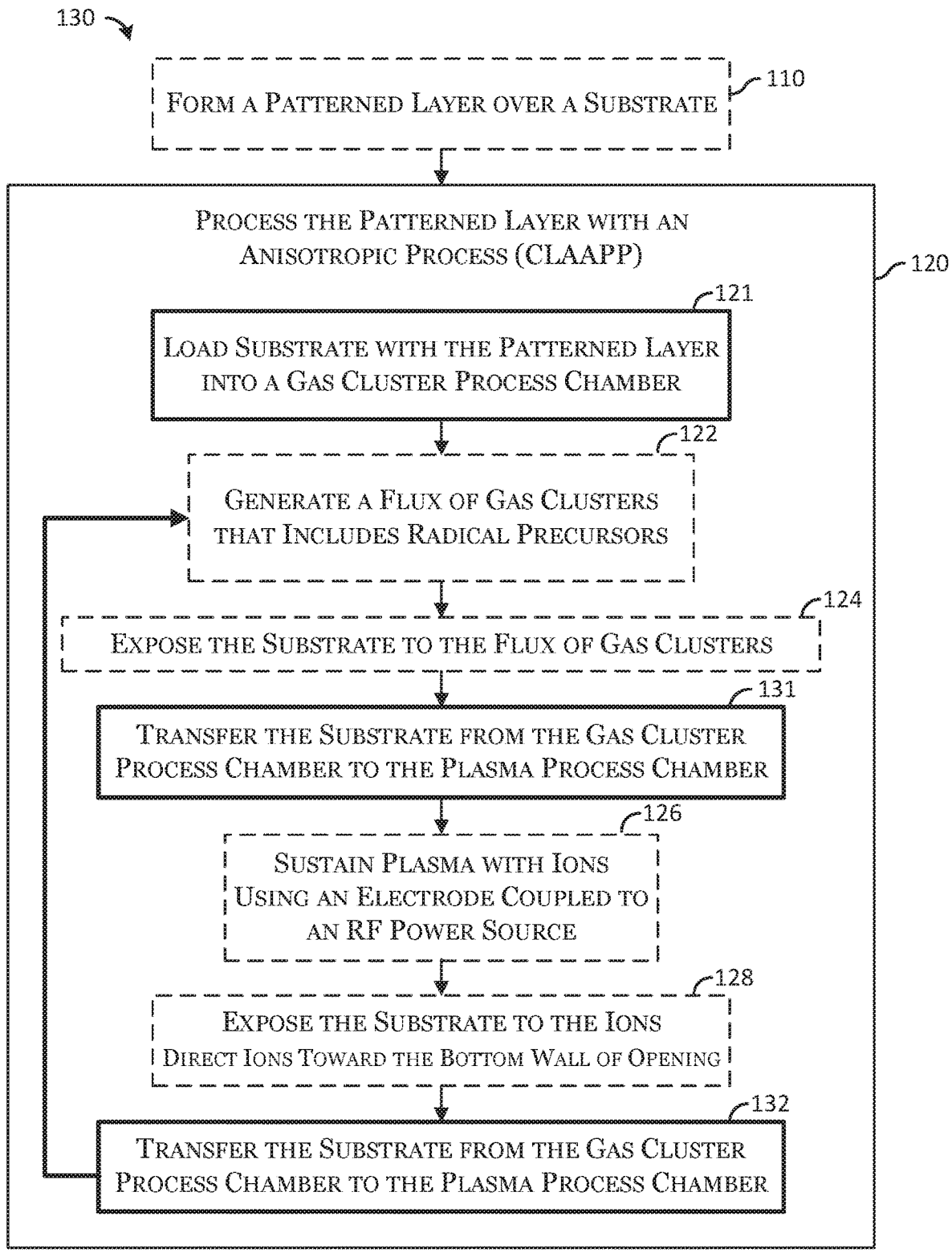
FIG. 1B is a flow diagram of a method for processing a substrate with the gas cluster assisted anisotropic plasma process illustrated in FIG. 1A using a cyclic process flow utilizing two process chambers.
Figure 1C:
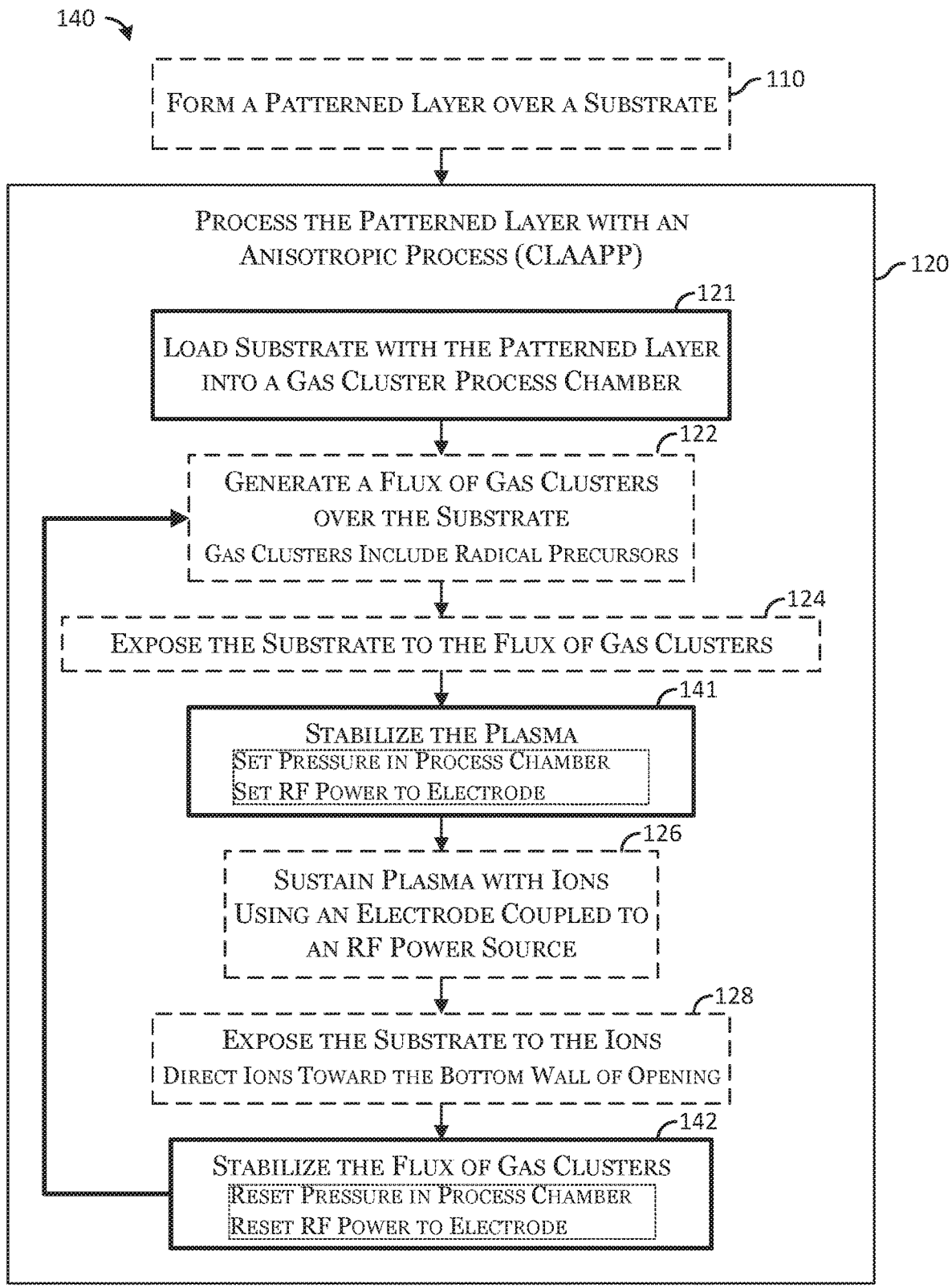
FIG. 1C is a flow diagram of a method for processing a substrate with the gas cluster assisted anisotropic plasma process illustrated in FIG. 1A using a cyclic process flow utilizing one process chamber.

First, a description of the general CLAAPP method 100 is provided using the flow diagram in FIG. 1A. Two embodiments of the general method 100 are illustrated in the flow diagrams in FIGS. 1B and 1C. FIG. 1B illustrates a two-chamber CLAAPP method 130 and FIG. 1C illustrates a single chamber CLAAPP method 140. Next, an example application of the general CLAAPP method 100 is described with reference to the cross-sectional views in FIGS. 2A-2I illustrating the formation of a high aspect ratio opening (e.g., a hole or trench) in a layer (e.g., a dielectric layer such as silicon oxide). The two chambers of the two-chamber CLAAPP method 130 are described using the cross-sectional views and schematics illustrated in FIGS. 3A and 3B, and the single chamber of the single chamber CLAAPP method 140 is described with reference to FIG. 4. Various aspects of the design of the gas cluster assisted plasma processing systems (described with reference to FIGS. 3A-3B and FIG. 4) are discussed using the illustrations in FIGS. 5A-5D, FIG. 6, FIGS. 7A-7E, and FIG. 8.

FIG. 1A illustrates the flow diagram for the general CLAAPP method 100. First an incoming substrate (e.g., a semiconductor substrate) is prepared by forming a patterned layer over a substrate. As indicated in block no, the patterned layer comprises narrow openings formed using a suitable photolithography and etch technique, as known to persons skilled in the art.

The patterned layer is then processed using the CLAAPP etch technique. As indicated by the block 120, CLAAPP etching comprises several parts: generating a flux of gas clusters over the substrate (box 122), exposing the substrate to the flux of gas clusters (box 124), sustaining plasma using radio frequency (RF) power (box 126), and exposing the substrate to a vertically directed flux of ions extracted from the plasma (box 128).

The gas clusters are formed from a condensable gas that is a source of radicals, referred to as a radical precursor. Examples of radical precursors include oxygen, carbon monoxide, hydrogen, chlorine, carbon tetrachloride, silicon tetrachloride, boron trichloride, fluorine, carbon tetrafluoride, nitrogen trifluoride, sulfur hexafluoride, trifluoromethane, a fluorocarbon, a hydrofluorocarbon, and the like. Gas clusters may be formed by injecting condensable gas through nozzles into a vacuum chamber. The radical precursor gas, injected into a process chamber through nozzles at several times the speed of sound, may cool and condense by adiabatic expansion to form loosely bound gas clusters. The average cluster size may be about 1,000 to about 10,000 molecules per cluster, in accordance with various parameters of the process and equipment such as the temperature of the radical precursor gas, the nozzle design, and the pressure gradient between the intake and exit of a nozzle. The flux of gas clusters, thus generated in the process chamber, may continue further toward a substrate placed on a substrate holder below. The process chamber may be loaded with the incoming substrate comprising the openings in the patterned layer, and pumped down to a low pressure using a vacuum system. Upon reaching the substrate, a cluster may enter a cavity that is exposed to the flux of gas clusters by a masking layer and, subsequently, participate in the CLAAPP etch process, as described in further detail below.

As shown in block 120 of the flow diagram in FIG. 1A, the substrate is also exposed to ions extracted from plasma to perform the CLAAPP etch. The ions may be directed vertically toward the bottom wall of the opening and remove material as they impinge on the bottom wall and interact with the surface.

FIG. 1B illustrates the flow diagram for a two chamber method 130. In the two chamber method 130, the CLAAPP process is implemented as a cyclic process performed in two separate process chambers. In the flow diagram for the cyclic the two chamber method 130, the steps specific to this method are indicated by solid rectangles. As indicated in box 121 in FIG. 1B, the cyclic CLAAPP process is initiated with the incoming substrate being loaded in a gas cluster process chamber in which a flux of gas clusters is formed. After exposing the substrate to the flux of gas clusters (box 124), the substrate is transferred through a transfer chamber to a plasma process chamber, as indicated in box 131 in FIG. 1B. The transfer chamber may be designed to have a small volume to facilitate a fast transfer between the two process chambers. In the plasma chamber, an electrode coupled to an RF power source sustains plasma from which ions are extracted (box 126). One cycle of the cyclic CLAAPP process is completed by exposing the substrate to the ion flux (box 128). After exposing the substrate to the ions (box 128), the substrate may be transferred back to the gas cluster process chamber (box 132) to perform the next cycle. A plurality of cycles may be performed to complete the formation of the high aspect ratio features.

In some embodiment, the CLAAPP process may be implemented in a single chamber by a method in which the substrate is concurrently exposed to the flux of gas cluster flux and the vertically directed ion flux. The process parameter space (e.g., chamber pressure, substrate temperature, gas flow rates, RF power, and the like) for concurrent processing is more constricted relative to cyclic processing. In some applications, this may limit the capability of the respective CLAAPP process from forming ultra-high aspect ratio features. Higher process flexibility in a single chamber implementation may be provided by using a cyclic CLAAPP process.

FIG. 1C illustrates the flow diagram for a single chamber method 140 where exposing the substrate to the flux of gas clusters and exposing the substrate to the ions are part of one cycle of a cyclic CLAAPP etch process. The steps specific to the cyclic single chamber method 140 are indicated by solid rectangles. As indicated in box 141 in FIG. 1C, after exposing the substrate to the flux of gas clusters (box 124), the pressure in the process chamber and the RF power to an electrode may be set to obtain stable plasma over the substrate, as indicated in box 141 in FIG. 1C. Exposing the substrate to the ion flux (box 128) completes one cycle of the cyclic CLAAPP process. The process chamber may then be prepared to perform the next cycle by resetting the chamber pressure and resetting the RF power to generate a stable flux of gas clusters, as indicated in box 142.

Application of a cyclic CLAAPP process to form an ultra-high aspect ratio opening in a target layer 210 of a substrate is now described with reference to the cross-sectional views illustrated in FIGS. 2A-2I.

Figure 2A:
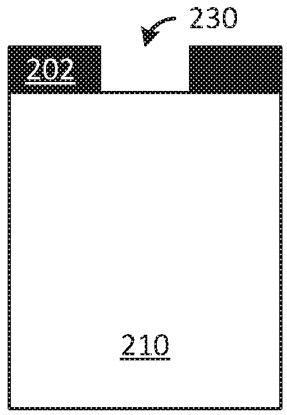
FIGS. 2A-2I illustrate cross-sectional views of a substrate at various intermediate stages of processing a substrate with a gas cluster assisted anisotropic plasma process, in accordance with an embodiment.

FIG. 2A illustrates a mask layer 202 patterned over the target layer 210. In various embodiments, the target layer 210 may comprise silicon oxide, silicon oxynitride, alternating layers of silicon oxide and silicon nitride, silicon, germanium, silicon-germanium alloy, or the like, and in one embodiment silicon dioxide. In one embodiment, the mask layer 202 may be a stack of layers comprising a bottom layer of SOC, a middle layer of silicon nitride, and a top layer of metal oxide photoresist. In another embodiment, the mask layer 202 may comprise, for example, a stack of a top organic photoresist layer, adjacent to an inorganic anti-reflective coating (ARC) and/or a hard mask layers.

Photoresists may be light-sensitive organic polymers, polymer precursors dissolved in organic solvents, or molecular systems based around small molecules, for example, hafnium core nanoparticles, metal oxides, and molecular glasses.

Hard masks may comprise materials such as silicon-rich anti-reflective coating (SiARC), silicon nitride, silicon carbide, titanium nitride, tantalum nitride, silicon boride, hafnium oxide, an organic layer such as spin-on carbon (SOC), or a combination thereof.

In one example embodiment, illustrated in FIG. 2A, the target layer 210 may comprise silicon oxide and the mask layer 202 may be a stack comprising a bottom layer of SOC, a middle layer of silicon nitride, and a top layer of metal oxide photoresist. A narrow opening 230 (e.g., about 10 nm to about 30 nm wide via) is shown exposing a portion of the surface of target layer 210 in the mask layer 202. The opening 230 may be formed using a suitable photolithography and etch technique, such as EUV lithography and anisotropic plasma etch technique. In various embodiments, the plasma etch chemistry may be using, for example, methane, tetrafluoromethane, trifluoromethane, nitrogen trifluoride, oxygen, or sulfur dioxide, or the like, or combinations thereof. The gaseous mixture may include an inert gas (e.g., argon and helium). In some embodiment, the plasma may be a capacitively coupled plasma (CCP) sustained using an RF source power of about 300 W to about 1 kW at a frequency of, for example, 40 MHz, coupled to a top disc electrode, and a low RF bias power, not exceeding 100 W, at a standard frequency of, for example, 13.56 MHz coupled to a substrate holder in a plasma process chamber. In another embodiment, the RF source power may be coupled to a helical resonator coil to sustain an inductively coupled plasma (ICP).

Figure 2B:
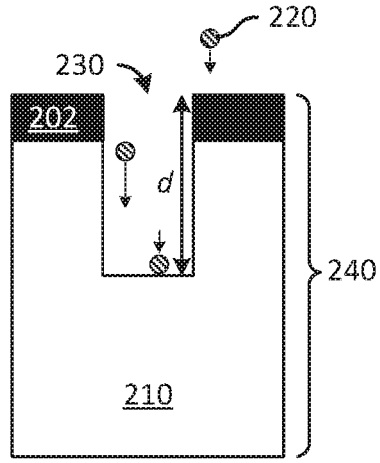

FIG. 2B illustrates the initial patterned layer 240 formed by etching the target layer 210 using, for example, anisotropic plasma etching such as RIE with fluorine chemistry. In various embodiments, the plasma may be using a gaseous mixture comprising, for example, tetrafluoromethane, hexafluorocyclobutene, octafluorocyciobutane, or nitrogen trifluoride, or the like. Other gases may include oxygen and an inert gas such as argon or helium. The plasma may be sustained using an RF bias power of about 10 kW to about 20 kW at, for example, a standard frequency of 13.56 MHz. The RF source power provided may be about 1 kW to about 5 kW at a frequency of, for example, 40 MHz or 60 MHz. In addition, there may be a DC bias of about 500 V to about 1000 V. In some embodiments, pulsed DC bias with a duty cycle of about 10% to about 50% may be used at a low frequency in the range of 1 kHz to 10 kHz and, in one embodiment, 5 kHz. The chamber pressure may be from 10 mTorr to 100 mTorr in various embodiments, and 25 mTorr, in one embodiment and the chamber temperature may be controlled at a temperature in the range 80° C. to 100° C.

In FIG. 2B, a vertical flux of ions 220 have been used to anisotropically remove silicon dioxide from the exposed surface of target layer 210 to increase the cavity of the opening 230 up to a depth, d. In various example embodiments, the aspect ratio of the openings 230 in the patterned layer 240 in FIG. 2B may be about 30 to about 60 for the minimum width features, and the minimum width may be from about 10 nm to about 30 nm. Formation of the initial patterned layer 240 is completed at the completion of the etch step. The substrate with the patterned layer 240 comprising openings 230, each having a cavity of depth, d, etched into the mask layer 202 and the target layer 210 is the incoming substrate for the gas cluster step of the cyclic CLAAPP process.

Figure 2C:
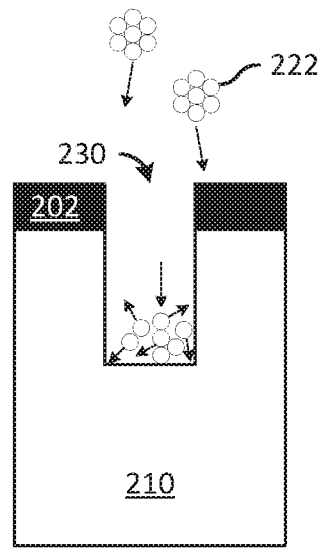
Figure 2D:
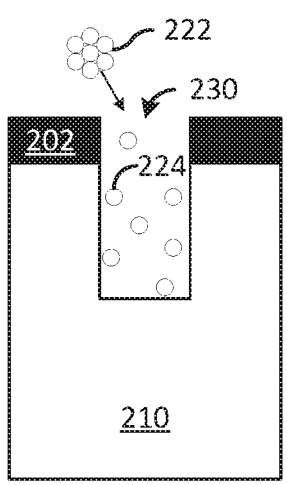
Figure 2E:
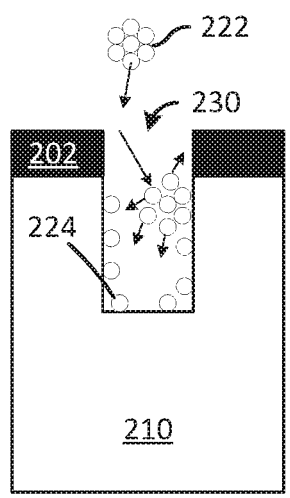
Figure 2F:
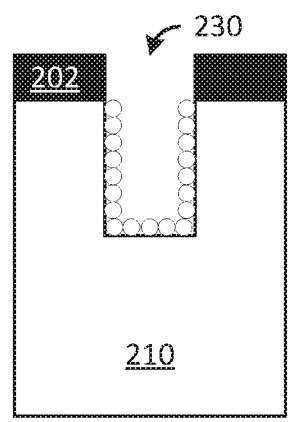
Figure 2G:
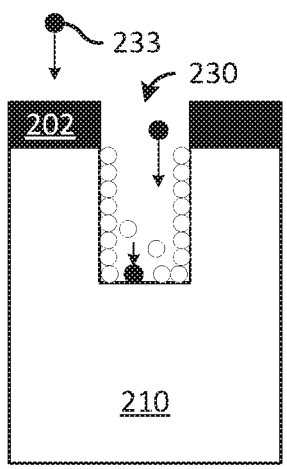
Figure 2H:
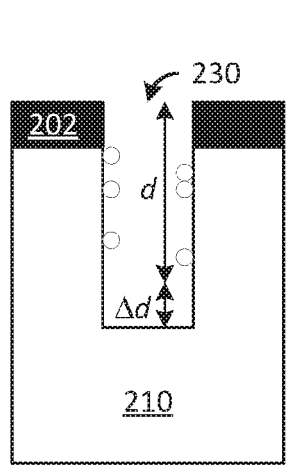
Figure 2I:
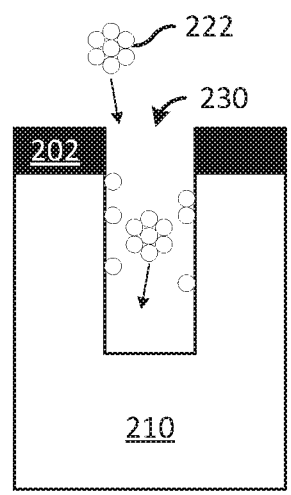

FIGS. 2C-2H illustrate one cycle of the example cyclic CLAAPP etch process: FIGS. 2C-2F illustrate treating the surface with gas clusters, and FIGS. 2G-H illustrate increasing the cavity depth using directed ions. The cross-sectional view in FIG. 2I illustrates the substrate at the beginning of the next cycle.

In FIG. 2C, the incoming substrate is exposed to a flux of gas clusters 222 generated by condensation of a radical precursor gas, as described above with reference to FIG. 1A. The radical precursor gas may be a fluorocarbon, for example, tetrafluoromethane, and the gas clusters 222 may comprise clusters of various sizes. In various embodiments, the average cluster size of about 1,000 to about 10,000 molecules. A gas cluster entering the cavity of an opening 230 (e.g., a hole or trench) is likely to collide with a cavity wall and disintegrate into smaller particles like mud splattering on a car windshield, as illustrated in FIG. 2C. Radicals (e.g., fluorine radicals), thus released from the gas cluster, are delivered in the cavity of the hole.

As illustrated schematically in FIG. 2D, because a disintegrating cluster may release thousands of radicals, the number of radicals and, thereby, the local mole density of gas deep in the cavity of opening 230 increases greatly. As indicated by the Ideal Gas Equation, an increase in mole density is accompanied by a proportional increase in the ratio (P/T), where P denotes pressure and T denotes absolute temperature. The process of gas cluster disintegration by collision with the sidewall or bottom wall of the opening 230 is roughly isothermal because a relatively large thermal capacity makes the substrate equivalent to a heat sink. Accordingly, the local pressure in the cavity may increase by several orders of magnitude.

FIG. 2E illustrates that many of the released radicals get adsorbed on the walls of the opening 230 either by chemisorption or by physisorption facilitated by the increased pressure inside the cavity. During the exposure to the flux of gas clusters, the cluster disintegration and adsorption process continues to line the surface of the walls of opening 230 comprising, for example, silicon dioxide, with a layer of radicals (e.g., fluorine radicals).

By the time the gas cluster exposure step is complete, the walls of the opening 230 may be saturated with radicals, as illustrated in FIG. 2F.

As shown in FIG. 2G, after the opening 230 has been lined with radicals, the substrate may be exposed to a vertical flux of ions 233 extracted, for example, from direct plasma sustained above the substrate using a gas mixture such as a mixture of an inert gas such as argon, and a fluorocarbon such as tetrafluoromethane ($CF_4$) in about equal proportions along with a small amount of oxygen. In the example embodiment, the plasma may be sustained by RF source power of about 100 W, and in various embodiments from 50 W to 200 W, coupled to a coil-shaped electrode. The RF bias power, coupled to a substrate-holder, may be about 5 kW in the example embodiment, and 1 kW to 10 kW, in various other embodiments. The RF source power and RF bias power may be at a standard frequency of, for example, 13.56 MHz. The chamber pressure may be in the range of 0.1 mTorr to about 10 mTorr.

In the example embodiment illustrated in FIG. 2G, the ions 233 may comprise argon ($Ar^k$) and trifluoromethyl cation ($CF_3^+$). The vertically accelerated ions 233 interact with the material of the target layer 210 (e.g., silicon dioxide), imparting sufficient energy to break, for example, silicon-oxygen bonds as they impinge upon the bottom wall of the opening 230. During this process, material close to the surface may be removed. Silicon atoms displaced from the silicon dioxide react with fluorine radicals forming $SiF_4$ gas, and oxygen atoms released from the broken Si—O bonds react with carbon present in $CF_3+$ to form CO and $CO_2$ gas. These volatile gases may be pumped out by a vacuum system. The ion exposure step completes one cycle of a cyclic CLAAPP etch process flow, such as the two-chamber CLAAPP method 130 illustrated in FIG. 1B or the single chamber CLAAPP method 140 illustrated in FIG. 1C.

As illustrated in FIG. 2H, at the end of the cycle, exposure of the substrate to the vertically directed ions 233 has anisotropically removed material (e.g., silicon dioxide) from the bottom wall of the opening 230 to extend the initial depth, d, by an amount Δd, and the chemical reactions associated with the removal have depleted the number of radicals in the opening 230. The substrate is then exposed again to the gas clusters, thereby starting the second cycle, as illustrated in FIG. 2I. The process alternates between the gas cluster step and the plasma step, repeatedly extending the depth of the cavity for a predetermined number of cycles till an ultra-high target aspect ratio for the opening 230 may be achieved.

Figure 3A:
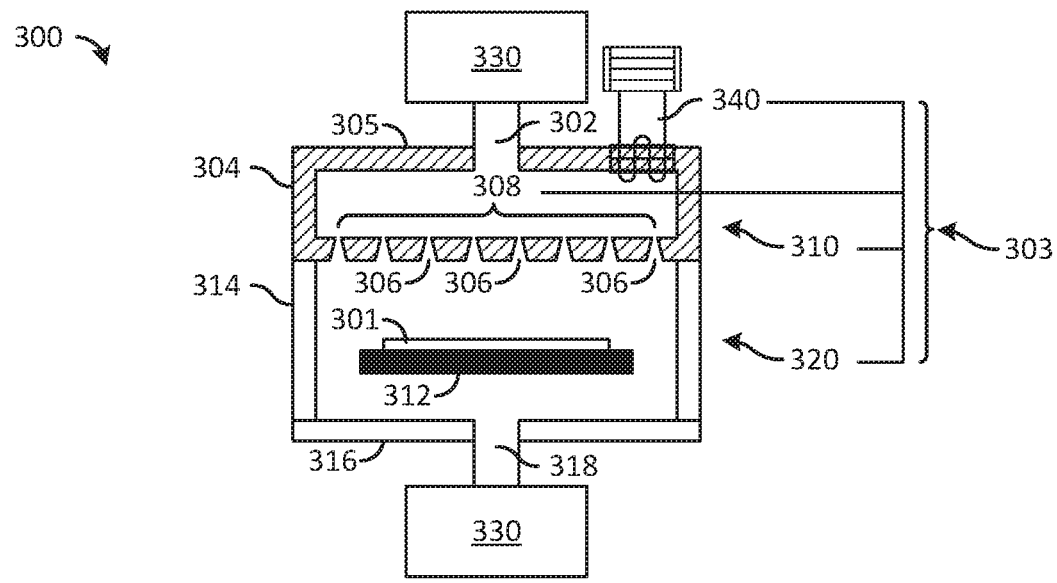
FIG. 3A illustrates a cross-sectional view of a subsystem comprising a plenum and gas cluster process chamber of a system for processing a substrate with a gas cluster assisted anisotropic plasma process, in accordance with an embodiment.
Figure 3B:
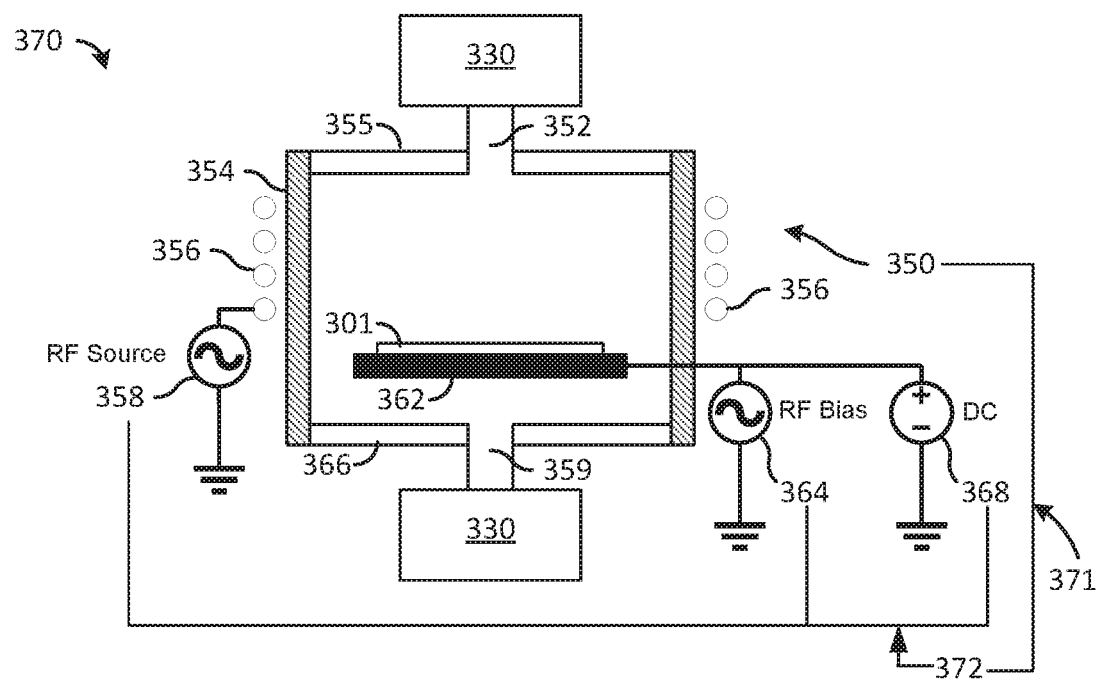
FIG. 3B illustrates a cross-sectional view of a subsystem comprising a plasma process chamber of a system for processing a substrate with a gas cluster assisted anisotropic plasma process, in accordance with an embodiment.

Two subsystems of a CLAAPP system that may be used to implement the two-chamber CLAAPP method 130 described with reference to FIG. 1B are illustrated in the cross-sectional views in FIGS. 3A and 3B. FIG. 3A illustrates a gas-cluster subsystem 300 and FIG. 3B illustrates a plasma subsystem 370.

The gas-cluster subsystem 300 in FIG. 3A comprises a first process chamber 303 and a gas flow system 330. The first process chamber 303 comprises a plenum 310, a nozzle assembly 308, and a gas cluster process chamber 320, wherein the substrate 301 may be processed. The gas flow system 330, connected to the gas inlets and exits of the CLAAPP system, control the flow of various gases through the plenum 310 and the gas cluster process chamber 320. The first process chamber 303 may also include an optional cooling system 340 coupled to the plenum 310.

The radical precursor gas may be introduced in the plenum 310 through a gas inlet 302 in a gas flow at a relatively high pressure of about 100 Torr to about 760 during gas cluster processing. At other times, a minimum plenum pressure to stop back flow is applied, and the plenum pressure may be as low as 0.1 Torr, depending on the pressure in the gas cluster process chamber 320. The various gas pressures in the first process chamber 303 are controlled by the gas flow system 330. As known to persons skilled in the art, a gas flow system may comprise various components such as high pressure gas canisters, valves (e.g., throttle valves), pressure sensors, gas flow sensors, vacuum pumps, pipes, and electronically programmable controllers. In the example embodiment illustrated in FIG. 3A, the gas inlet 302 is coupled to a top cover 302 of the plenum 310. In another embodiment, the radical precursor gas may be introduced through a gas inlet coupled to a sidewall 304 of the plenum 310.

The relatively high pressure in the plenum 310 forces the radical precursor gas to flow into intake apertures of an array of nozzles 306 of a nozzle assembly 308 and flow out through output apertures of the nozzles 306. While the intake apertures of the nozzle assembly 308 are coupled to the cavity inside the plenum 310, the output apertures of the nozzle assembly 308 are coupled to a low pressure gas cluster process chamber 320 disposed on the opposite side, as illustrated in FIG. 3A. In various embodiments, the nozzles 306 may be of various shapes, such as a tube, a truncated cone, a funnel having a stem coupled to the plenum, or a convergent-divergent de Laval nozzle. The geometrical parameters of the nozzle are discussed in further detail below with reference to FIGS. 5A-5D.

The gas cluster process chamber 320 adjacent to the nozzle assembly 308 comprises a substrate holder 312, and a gas outlet 318, as illustrated in FIG. 3A. A substrate 301 is shown loaded on the substrate holder 312. The gas cluster process chamber 320 may be maintained at a low pressure by the gas flow system 330 using vacuum pumps. As explained above, the difference in pressure across the nozzle assembly is designed to rapidly cool the radical precursor gas by adiabatic expansion to condense the gas forming nanometer scale clusters of gas molecules weakly bound by van der Waals forces. Depending on the target gas flow rate of the CLAAPP process, the target pressure in the gas cluster process chamber 320 may be selected to be about 0.1 mTorr to about 10 mTorr, in various embodiments. During gas cluster formation, the ratio of the pressures at the intake to the pressure at the output of each nozzle 306 of the nozzle assembly 308 has to be high, for example, greater than 10; typically the ratio exceeds 1000.

The plasma subsystem 370 in FIG. 3B comprises a second process chamber 371 and a gas flow system 330. The second process chamber 371 comprises a plasma process chamber 350 and an electrical system 372 comprising power sources such as an RF bias power source 364 and a source RF power source 358 for powering a plasma in the plasma process chamber 350. The electrical system 372 may also include an optional DC bias source 368. The plasma subsystem 370 may be configured to perform the anisotropic etching using a directional ion flux, as described above with reference to FIGS. 2G and 2H. The plasma process chamber 350 may sustain plasma directly above the substrate 301 loaded onto a substrate holder 362. A gaseous mixture used to generate the ions for the plasma etching may be introduced in the plasma process chamber 350 through a gas inlet 352 and the gaseous byproducts may be pumped out through a gas outlet 359. The gas flow rates and chamber pressure are controlled by the gas flow system 330 coupled to the gas inlet 352 and the gas outlet 359. Bias power from an RF bias power source 364 and RF source power from an RF power source 358 may be supplied to respective electrodes of the plasma process chamber 350. In the example embodiment illustrated in FIG. 3B, the RF bias electrode is also the substrate holder 362 and the RF source power is supplied to a helical resonator 356 coiled around a dielectric sidewall 354. A pulsed DC bias may also be used instead of the RF bias power source 364. An optional DC bias source 368 is also shown coupled to the substrate holder 362. In FIG. 3B, the gas inlet 352 is coupled to a conductive top plate 355 and the gas outlet is coupled to a conductive bottom plate 366. The conductive top plate 355 and bottom plate 366 may be electrically connected to the system ground (a reference potential).

The configuration of the plasma subsystem 370 described above with reference to FIG. 3B is by example only. In alternative embodiments, various alternative configurations may be used for the plasma subsystem 370. For example, inductively coupled plasma (ICP) may be used with RF source power coupled to a planar coil over a top dielectric cover, or capacitively coupled plasma (CCP) generated using a disc-shaped top electrode in the plasma process chamber 350, the gas inlet and/or the gas outlet may be coupled to the sidewall, etc. Pulsed RF power sources and pulsed DC power sources may also be used in some embodiments (as opposed to continuous wave RF power sources). In various embodiments, the RF power, chamber pressure, substrate temperature, gas flow rates and other plasma process parameters may be selected in accordance with the respective process recipe.

Figure 4:
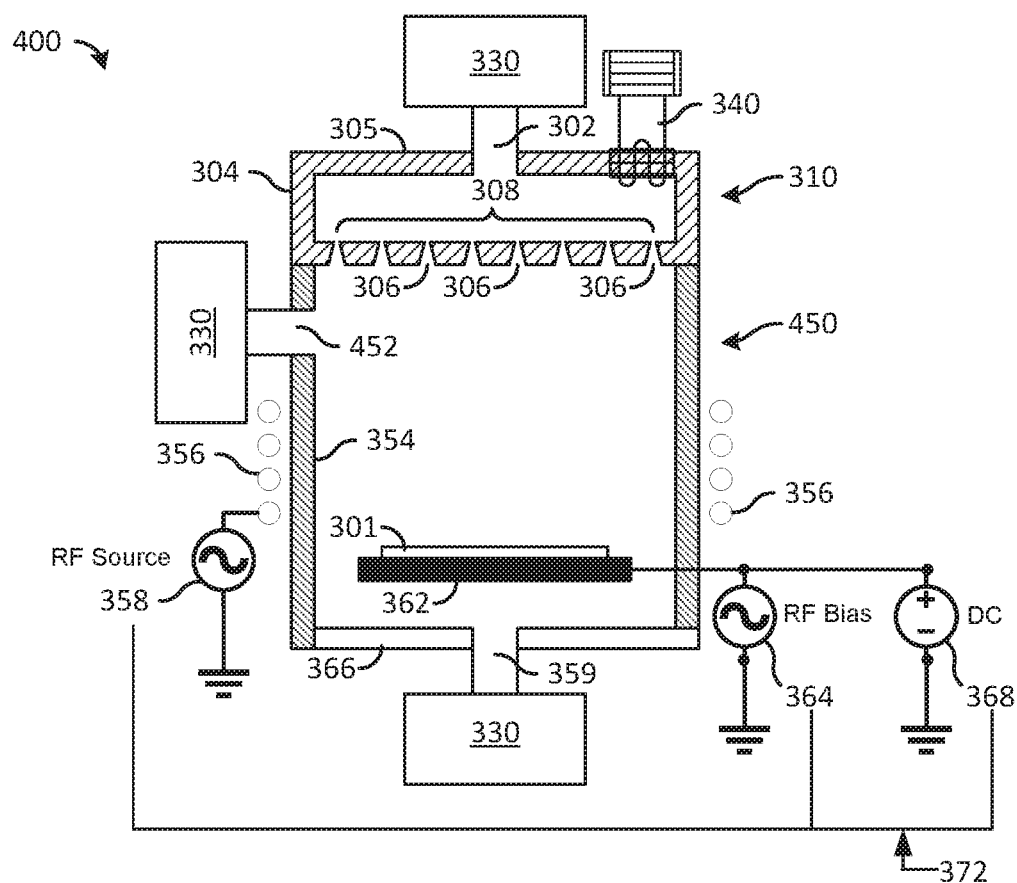
FIG. 4 illustrates a cross-sectional view of a system for processing a substrate with a gas cluster assisted anisotropic plasma process, in accordance with an embodiment.
Figure 5A:
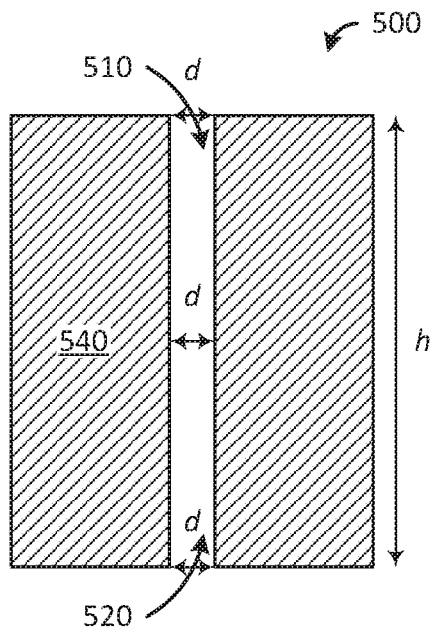
FIGS. 5A-5D illustrate cross-sectional views of a nozzle of various design types for a system for processing a substrate with a gas cluster assisted anisotropic plasma process, in accordance with an embodiment.
Figure 5B:
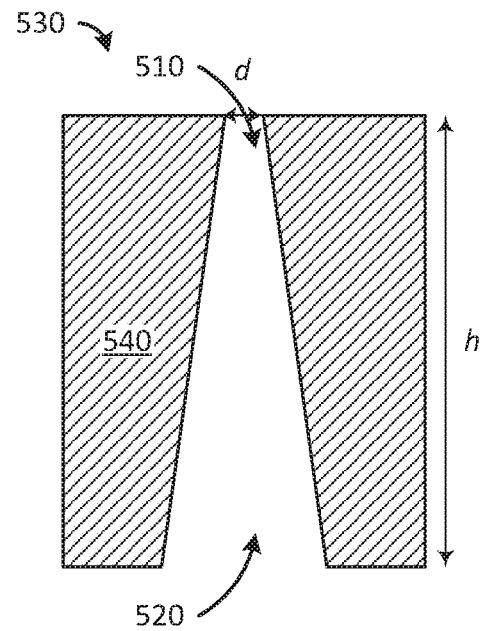
Figure 5C:
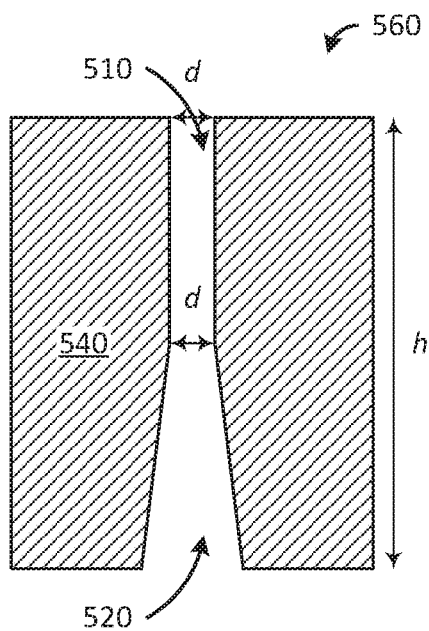
Figure 5D:
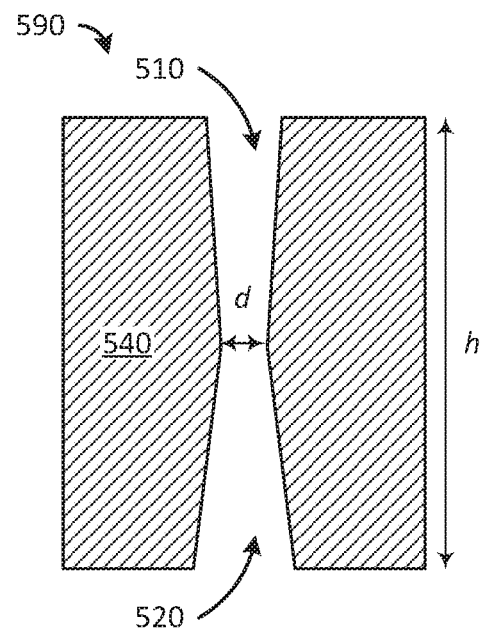

FIG. 4 illustrates a single chamber CLAAPP system 400 to implement a gas cluster assisted anisotropic plasma processing system. The single chamber CLAAPP system 400 may be used to execute a cyclic single chamber CLAAPP method 140, as described with reference to the flow diagram in FIG. 1C. In the cyclic single chamber CLAAPP method 140, the substrate (e.g., the semiconductor substrate 301) is alternately exposed to a flux of gas clusters and a directed flux of ions. Furthermore, the single chamber CLAAPP system 400 may enable a concurrent CLAAPP method, wherein time-consuming chamber resets between the gas cluster process step and plasma process step are eliminated. In the concurrent CLAAPP method, exposing the substrate to the flux of gas clusters and exposing the substrate to the ions may be performed concurrently using the single chamber CLAAPP system 400.

As illustrated in FIG. 4, the single chamber CLAAPP system 400 integrates the two subsystems 300 and 370 (described above with reference to FIGS. 3A and 3B) with a few adjustments. The single chamber CLAAPP system 400 comprises a plenum 310 and a substrate processing chamber 450, where a substrate 301 may undergo processing by gas clusters as well as processing by plasma. In addition, the single chamber CLAAPP system 400 comprises a gas flow system 330, an optional cooling system 340, and an electrical system 372 comprising one or more power sources such as an RF bias power source 364, a source RF power source 358, and an optional DC bias source 368.

The substrate processing chamber 450 may be described as a combined gas cluster process chamber 320 (illustrated in FIG. 3A) and a plasma process chamber 350 (illustrated in FIG. 3B), wherein the substrate processing chamber 450 has been modified from the plasma process chamber 350. The modifications comprise coupling the plenum 310 to the substrate processing chamber 450 through the nozzle assembly 308, and including an additional gas inlet 452 to introduce the gaseous mixture that may be used to generate plasma. With these modifications, the single chamber CLAAPP system 400 may perform the cyclic single chamber CLAAPP method 140 (described above with reference to FIG. 1C) as well as the concurrent CLAAPP method.

In the execution of the cyclic single chamber CLAAPP method 140, the process parameters selected for the plenum 310 and the substrate processing chamber 450 are alternating between two sets of values. During exposing the substrate 301 to the flux of gas clusters, in various embodiments, the gas pressure in the plenum 310 is selected to be in the range 100 Torr to 760 Torr and between 0.1 mTorr and 10 mTorr in the substrate processing chamber 450. However, during exposing the substrate 301 to the flux of ions, the gas pressure in the plenum 310 may be reduced but maintained high enough to stop back flow; for example, the plenum pressure may be about 0.1 Torr to about 10 Torr in various embodiments, and about 1 Torr in one embodiment. In various embodiments, the pressure in the substrate processing chamber 450 may be between 0.1 mTorr to 10 mTorr, depending on the requirements of the plasma etch process.

The processing conditions for concurrent processing may be more constrained than the processing conditions for cyclic processing. For example, the pressure in the combined gas cluster and plasma process chamber, referred to here as the substrate processing chamber 450, may have to accommodate the constraint of low pressure for generating gas clusters of a reasonable average cluster size and maintain a reasonable flux of gas clusters passing through the plasma discharge and reaching the substrate 301. Simultaneously, the pressure has to be controlled within a window needed to perform the respective plasma etch process. In various embodiments, the pressure in the substrate processing chamber 450 may be maintained roughly less than or equal to 10 mTorr and greater than or equal to 0.1 mTorr when performing a concurrent CLAMP method. The plenum 310 may be maintained at a pressure in the range of 100 Torr to 760 Torr in various embodiments, and about 380 Torr in one embodiment. The gas cluster formation process may be facilitated by pre-cooling the plenum 310 to a temperature in the range 100 K to 310 K using the cooling system 340. A low temperature in the plenum 310 may be advantageous if it is desirable to select a relatively low plenum pressure, for example, less than or equal to 380 Torr.

The formation process of van der Waals bound molecular gas clusters is known to be very sensitive to the absolute temperature, $T_0$, of the gas at the intake of the nozzle. The average number of molecules in a cluster ($N_C$) may be estimated from a semi-empirical scaling law, referred to as Hagena's formula. In the pressure ranges of interest, Hagena's formula predicts that $N_C \propto (\Gamma^*)^{2.35}$, where Hagena's parameter, $\Gamma^* \propto T_0^{-2.29}$, thereby making $N_C \propto T_0^{-5.38}$. In accordance with Hagena's formula, pre-cooling the gas by 100° C. from room temperature (from $T_0=300$ K to $T_0=200$ K) would roughly increase the cluster size ($N_C$) by almost an order of magnitude or provide the same average size of clusters at half the plenum pressure. Although these estimates are approximate, they indicate that, in some embodiments, it may be advantageous to include the cooling system 340 despite the added cost and complexity. In various embodiments, the temperature of the gas in the plenum may be selected to be controlled at a target value greater than or equal to 100 K and less than or equal to 310 K.

FIGS. 5A-5D illustrate cross-sectional views of a nozzle of various design types that may be used to generate gas clusters in the various embodiments of gas cluster assisted plasma processing systems described above, for example, the nozzles 306 in the nozzle assembly 308 of the systems illustrated in FIG. 3A and FIG. 4. Nozzles shaped like a tube 500, a truncated cone 530, a funnel having a stem 560, and a convergent-divergent de Laval nozzle 590 are shown in cross-sectional views in FIGS. 5a, 5B, 5C, and 5D, respectively. The structure of nozzles is a hole formed in a matrix 540, the hole having an intake aperture 510 and an exit aperture 520. In some embodiments, the matrix 540 may comprise a dielectric (e.g., a ceramic), and in some other embodiments the matrix 540 may comprise a metal (e.g., aluminum or copper). The narrowest region of a nozzle is referred to as its throat, indicated by a double arrow in FIGS. 5A-5D. The tube 500 is of uniform width, as indicated by multiple double arrows. The geometrical parameters describing the nozzles illustrated in FIGS. 5A-5D comprise a height, h, a throat width, d, an expansion ratio, E, and a cone half-angle, a (two cone half-angles for the de Laval nozzle 590). The expansion ratio, E, defined as the ratio of the area of the exit aperture to the area of the throat, is an important design parameter for nozzle design since it is advantageous to achieve adiabatic expansion and cooling prior to the gas leaving the nozzle through the exit aperture. Generally, E 1 is used, including the nozzle designs illustrated in FIGS. 5A-5D. However, a nozzle having a large a (very wide exit aperture) may not be desirable because, according to Hagena's formula for conical nozzles, $\Gamma^* \propto (0.74 \, d/\tan \alpha)^{0.85}$; hence the cluster size, $N_C$, may become too low for a given throat width, d. In various embodiments, the cone half-angle may be less than or equal to about 30°, and between 5° and 30° in one embodiment.

The nozzle height, h, and throat width, d, may be adjusted in the nozzle design for positioning the design within a desired range of flow rate and plenum pressure. As expected, reducing d or increasing h would reduce the flow rate for a given backing pressure, $P_0$, in the plenum. It is advantageous for the system design if the plenum pressure does not have to exceed 1 standard atmosphere without reducing the average cluster size, $N_C$, to below 1,000. It is estimated from Hagena's formula that $N_C \propto P_0^{2.35}$. In various embodiments, gas flow rates from about 50 sccm to about 1000 sccm may be achieved with an array of about 200 nozzles to about 1000 nozzles having a throat width, d, about 0.5 mm to about 1 mm and nozzle height, h, about 1 cm to about 5 cm.

Gas clusters of various sizes are propelled out of the exit aperture with exit velocities several times the velocity of sound in a spray that extends over a relatively large solid angle to be described as a collimated beam. In the embodiments of gas cluster assisted plasma processing systems and methods described above, the clusters have not been ionized and accelerated by electromagnetic fields as is typically done in gas cluster ion beam (GCIB) system. However, because, in the concurrent processing method, a fraction of the clusters may be scattered and disintegrated as they transit through the plasma sustained in the combined gas cluster and plasma process chamber 450 during processing, the single chamber CLAAPP system 400 may be modified to accelerate the clusters toward the substrate. The modifications are described with reference to FIG. 6, FIGS. 7A-7E, and FIG. 8.

Figure 6:
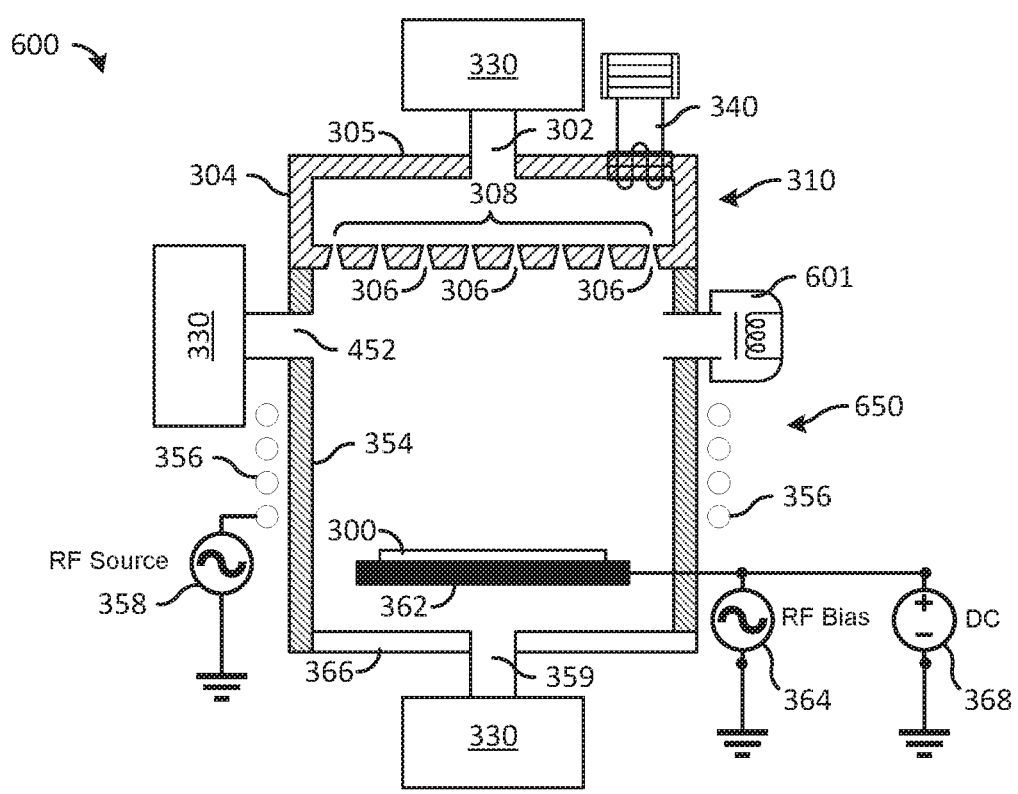
FIG. 6 illustrates a cross-sectional view of a system for processing a substrate with a gas cluster assisted anisotropic plasma process, in accordance with an embodiment.

FIG. 6 illustrates an embodiment of a single chamber CLAAPP system 600 comprising an electron beam ionizer 601 coupled to a process chamber, wherein the electron beam ionizer is configured to direct a beam of energetic electrons to intercept the flux of gas clusters in a combined gas cluster and plasma process chamber 650. Features of the single chamber CLAAPP system 600 are similar to those of the single chamber CLAAPP system 400 (described above with reference to FIG. 4), except for the addition of the electron beam ionizer 601. The energetic electrons from the electron beam ionizer 601 may ionize some of the gas clusters. The ionized gas clusters may then be accelerated by the bias electric fields generated using the RF bias power source 364 (or pulsed DC bias source), or the optional DC bias source 368 coupled to the substrate holder 362.

FIGS. 7A-7E illustrate polarizing nozzles 700, wherein conductive films 710 and 720 have been embedded in the matrix 540. The matrix 540 of the polarizing nozzles 700 is a dielectric material (e.g., a ceramic) with sufficient dielectric strength to insulate the conductive film 710 from the conductive film 720. Contacts may be made to the embedded conductive films 710 and 720 to connect them to electrodes to electrically couple the conductive films 710 and 720 to a pulsed DC bias source. The polarizing nozzles 700, in the embodiment illustrated in FIGS. 7A-7E, have the same shape of a funnel having a stem 560, illustrated in FIG. 5C.

Other shapes may be used in other embodiments. A top planar view in FIG. 7A shows an intake aperture 510 having a width equal to the throat width, d, and a bottom planar view in FIG. 7B shows the exit aperture 520 of the polarizing nozzles 700. The apertures are seen surrounded by a matrix 540 comprising a dielectric, such as ceramic. Dashed lines 7C and 7D indicate the cut planes used to obtain the cross-sectional views illustrated in FIGS. 7C and 7D, respectively.

Figure 7E:
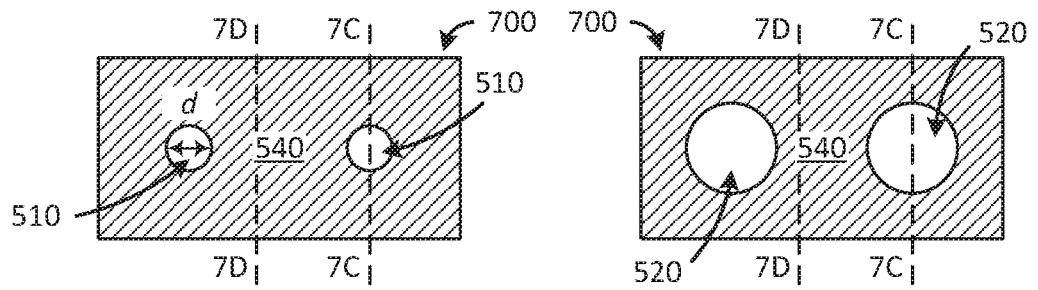
FIG. 7E illustrates an exploded view of a nozzle system with embedded electrodes for a system for processing a substrate with a gas cluster assisted anisotropic plasma process, in accordance with an embodiment.
Figure 7E:
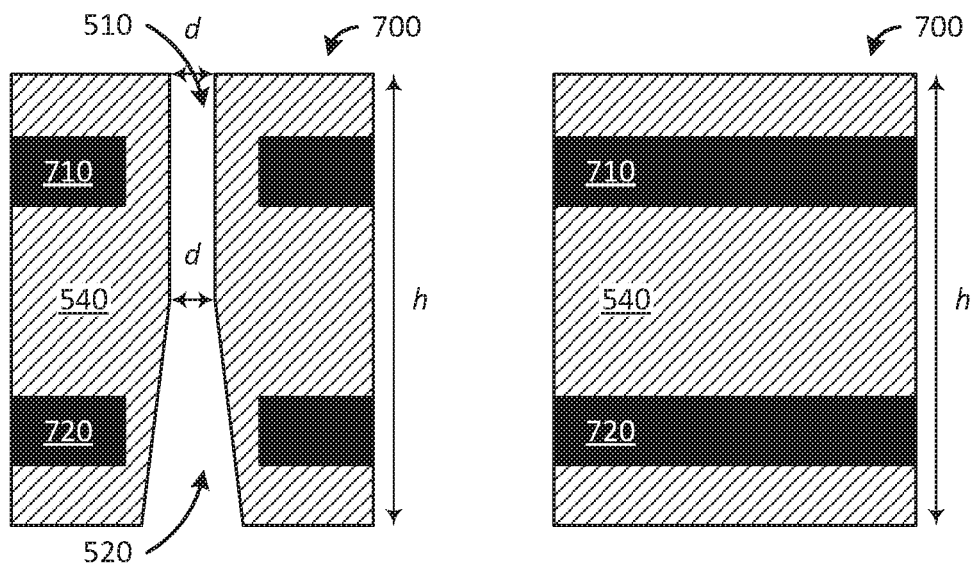
Figure 7E:
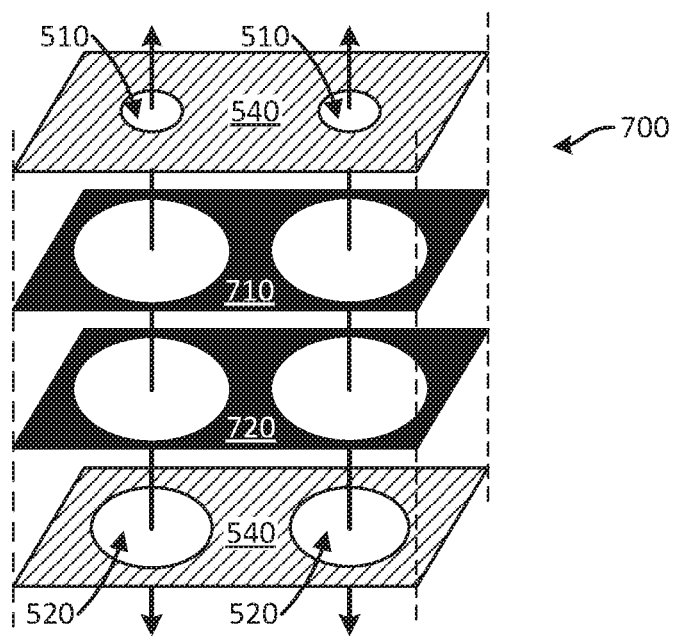

The cross-sectional view in FIG. 7C illustrates that the conductive films 710 and 720 comprise gaps. The nozzle holes, laterally surrounded by the dielectric matrix 540, pass through these gaps in the conductive films 710 and 720. The cross-sectional view in FIG. 7D illustrates that the conductive films 710 and 720 maintain electrical continuity through a continuous conductive region between adjacent nozzle holes. The structure of the polarizing nozzles 700, described with reference to the planar views in FIGS. 7A-7B in conjunction with the cross-sectional views in FIGS. 7C-7D, is further illustrated by an exploded view shown in FIG. 7E. In FIG. 7E, four planar views are shown vertically aligned to each other. The two vertical double arrows are shown passing through the center of the nozzle holes of two adjacent nozzles 700. The material between the four planes illustrating the exploded view in FIG. 7E has been removed for clarity. It is noted that the conductive films 710 and 720 are electrically insulated from each other by the dielectric matrix 540.

Figure 8:
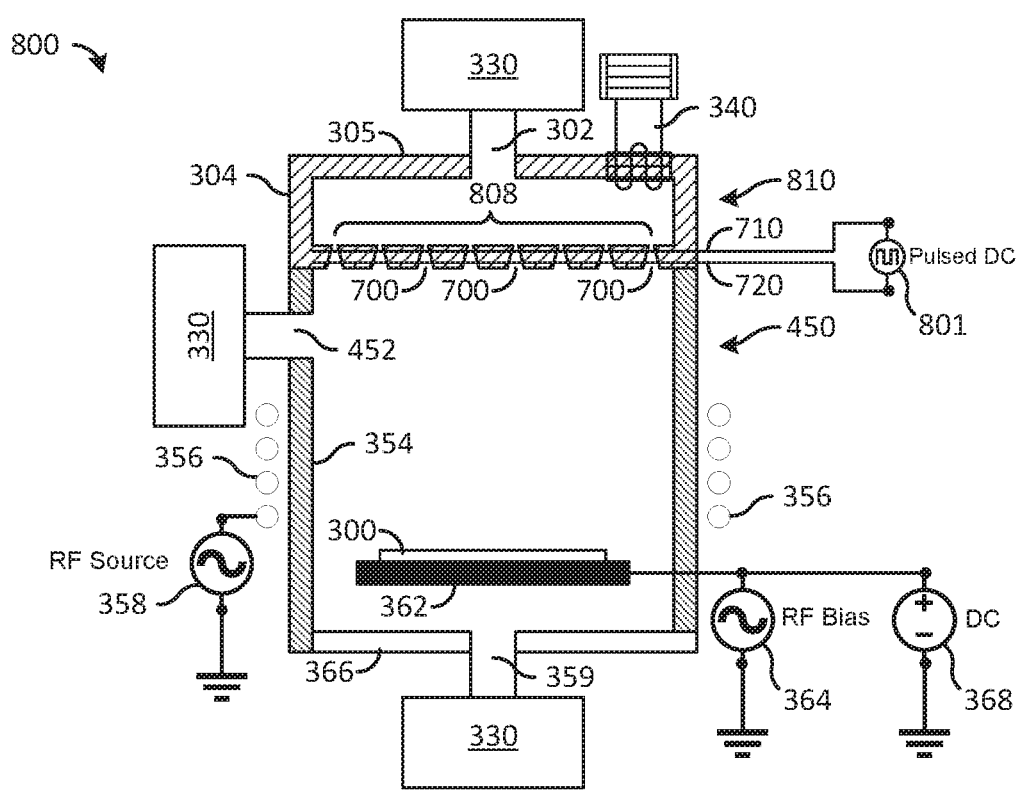
FIG. 8 illustrates a cross-sectional view of a system for processing a substrate with a gas cluster assisted anisotropic plasma process, in accordance with an embodiment.

FIG. 8 illustrates an embodiment of a single chamber CLAAPP system 800 wherein the polarizing nozzles 700 are being used in a nozzle assembly 808. The embedded conductive films 710 and 720 are indicated schematically by two solid lines. Electrical contacts may be made to the conductive films 710 and 720 in order to use them as electrodes. In FIG. 8, the conductive films 710 and 720 are shown schematically as being used as electrodes connected to a pulsed DC bias source 801.

Neutral gas clusters comprising polarizable atoms or molecules may be accelerated by an electric field gradient, in accordance with the laws of electromagnetic theory. It is also understood that, because of the conical geometry of the nozzle holes, a vertical electric field gradient may be generated by biasing the embedded conductive films 710 and 720 with an electrical potential difference. Accordingly, the pulsed DC source may be electrically coupled to the two embedded conductive films 710 and 720, thereby accelerating the polarized clusters vertically downward.

In this disclosure we have described a method of using gas clusters to supply radicals deep inside a high aspect ratio hole or trench. The embodiments described in this document provide the advantage of extending the capability of the maximum aspect ratio, $(AR)_{max}$, of contact/via holes etched using a single photolithography patterning step followed by one or more pattern transfer etching steps to the range of $100<(AR)_{max}<150$. Without the assistance of the gas cluster process, it may be difficult to obtain reasonable etch efficiency (e.g., >100 nm/min) at the bottom wall of a high aspect ratio (e.g., aspect ratio>100) cavity. Likewise, a rapid drop in radical flux with depth (relative to the vertically directed ion flux) severely limits the ability to maintain a high radical to ion flux ratio, for example, a desired ratio of $\Gamma_r/\Gamma_i>10$. Despite complex processing configurations, it may be extremely difficult to achieve Fr/F, beyond about 5 and also provide sufficient ions with enough kinetic energy (e.g., >10 keV) to etch the bottom of a high aspect ratio narrow feature (e.g., a hole or trench about 20 nm wide and several microns deep).

In contrast, by using the embodiments of gas cluster assisted plasma processing described in this disclosure, the capability of the etch process may be extended to form openings having a width of about 10 nm to about 30 nm and an aspect ratio of about 100 to about 150 using a single photolithography patterning step (e.g., EUV photolithography) followed by anisotropic pattern transfer etch processes using relatively simple plasma processing conditions, thereby lowering the processing cost and raising the process yield.

Various implementations of embodiments of the present application are discussed below.

Example 1. A method for processing a substrate includes forming a patterned layer over the substrate, the layer including an opening, where a surface of the opening includes a sidewall and a bottom wall. The method includes processing the patterned layer with an anisotropic process by generating a flux of gas clusters over the substrate in a first process chamber, where the gas clusters include radical precursors; exposing the substrate to the flux of gas clusters. The method includes sustaining plasma including ions in a second process chamber; and exposing the substrate to the ions by directing the ions toward the bottom wall of the opening.

Example 2. The method of example 1, where the first process chamber further includes a plenum, a nozzle assembly, and a gas cluster process chamber, and where the second process chamber includes a plasma process chamber, and a power source for powering a plasma in the plasma process chamber.

Example 3. The method of one of examples 1 or 2, where generating a flux of gas clusters and exposing the substrate to the flux of gas clusters includes: loading the substrate into the gas cluster process chamber; introducing a gas under pressure into a plenum through a gas inlet of the plenum; flowing the gas from the plenum to the gas cluster process chamber through a nozzle having an intake aperture coupled to the plenum and an exit aperture coupled to the gas cluster process chamber, the nozzle having an expansion ratio greater than or equal to unity, where the flowing the gas includes applying a gas pressure less than or equal to 760 Torr in the plenum; and where the flowing the gas cools the gas to form a gas cluster condensate in the gas cluster process chamber.

Example 4. The method of one of examples 1 to 3, where the first process chamber and the second process chamber are integrated as part of a single process chamber.

Example 5. The method of one of examples 1 to 4, where the exposing the substrate to the flux of gas clusters and the exposing the substrate to the ions are part of one cycle of a cyclic etch process including a plurality of cycles, each cycle of the plurality of cycles further including: after the exposing the substrate to the flux of gas clusters, stabilizing the plasma, where the stabilizing the plasma includes: introducing a gas under pressure into the plenum through a gas inlet of the plenum; setting the pressure in the single process chamber; setting the pressure in the plenum; and coupling a electrode of the process chamber to a radio frequency (RF) power source; and after the exposing the substrate to the ions, stabilizing the flux of gas clusters, the stabilizing the flux of gas clusters including resetting the pressure in the single process chamber, resetting the pressure in the plenum, and resetting the RF power coupled to the electrode of the process chamber.

Example 6. The method of one of examples 1 to 5, further including: concurrently performing the exposing the substrate to the flux of gas clusters and the exposing the substrate to the ions; and maintaining a pressure less than or equal to 10 mTorr and greater than or equal to 0.1 mTorr in the single process chamber.

Example 7. The method of one of examples 1 to 6, where the exposing the substrate to the flux of gas clusters and the exposing the substrate to the ions are part of one cycle of a cyclic etch process including a plurality of cycles, each cycle of the plurality of cycles further including: transferring the substrate from the first process chamber to the second process chamber after exposing the substrate to the flux of gas clusters; and transferring the substrate from the second process chamber to the first process chamber after exposing the substrate to the ions.

Example 8. The method of one of examples 1 to 7, where the gas clusters include oxygen, carbon monoxide, hydrogen, chlorine, carbon tetrachloride, silicon tetrachloride, boron trichloride, fluorine, carbon tetrafluoride, nitrogen trifluoride, sulfur hexafluoride, trifluoromethane, a perfluorocarbon, a hydrofluorocarbon, or any combination thereof, or in combination with an inert gas.

Example 9. A system for processing a substrate includes a first subsystem including: a plenum including a gas inlet; a nozzle assembly including a plurality of nozzles, where an intake aperture of each of the plurality of nozzles is disposed inside the plenum; and a gas cluster process chamber connected to the plenum through the plurality of nozzles of the nozzle assembly; and a gas flow system connected to the gas inlet and a gas outlet of the gas cluster process chamber, where the gas flow system is configured to generate a flux of gas clusters in the gas cluster process chamber. The system includes a second subsystem including a plasma process chamber, and a power source for powering a plasma in the plasma process chamber.

Example 10. The system of example 9, where an exit aperture of each of the plurality of nozzles is disposed outside the plenum, where each of the plurality of nozzles is shaped like a tube, a truncated cone, a funnel having a stem coupled to the plenum, or a convergent-divergent de Laval nozzle.

Example 11. The system of one of examples 9 or 10, where each nozzle of the nozzle assembly has: a length greater than or equal to 1 cm and less than or equal to 10 cm; a throat width greater than or equal to 0.5 mm and less than or equal to 1 mm; and an expansion ratio greater than or equal to 1 and less than or equal to 10.

Example 12. The system of one of examples 9 to 11, where the first subsystem further includes a cooling system coupled to the plenum, where the cooling system is configured to control the temperature of the gas in the plenum at a target value greater than or equal to wo K and less than or equal to 310 K.

Example 13. A system for processing a substrate includes a plenum; a substrate processing chamber disposed outside the plenum and configured to sustain a plasma; a nozzle having an intake aperture coupled to the plenum and an exit aperture coupled to the substrate processing chamber.

Example 14. The system of example 13, where the nozzle has an expansion ratio greater than or equal to unity, and where the nozzle is shaped like a tube, a truncated cone, a funnel having a stem coupled to the plenum, or a convergent-divergent de Laval nozzle.

Example 15. The system of one of examples 13 or 14, where the nozzle is a polarizing nozzle, the polarizing nozzle further including a dielectric matrix embedded with two conductive layers electrically insulated by the dielectric matrix, where the two conductive layers are configured to be electrically coupled to a pulsed DC bias source.

Example 16. The system of one of examples 13 to 15, further including a cooling system coupled to the plenum, where the cooling system is configured to control the temperature of a gas in the plenum at a target value greater than or equal to wo K and less than or equal to 310 K.

Example 17. The system of one of examples 13 to 16, further including a plurality of nozzles disposed adjacent the nozzle, the nozzle and the plurality of nozzles forming a nozzle assembly connecting the plenum with the substrate processing chamber.

Example 18. The system of one of examples 13 to 17, where the plenum includes a first gas inlet; where the substrate processing chamber includes: a second gas inlet; a substrate holder; and a gas outlet; and where the system further includes a gas flow system connected to the first gas inlet, the second gas inlet, and the gas outlet, where the gas flow generates a flux of gas clusters in the substrate processing chamber.

Example 19. The system of one of examples 13 to 18, where the substrate holder is coupled to a pulsed DC bias source or a radio frequency (RF) bias power source.

Example 20. The system of one of examples 13 to 19, further including an electrode coupled to a radio frequency (RF) power source, where the electrode is shaped like a coil disposed outside the substrate processing chamber, and where the electrode is configured to sustain inductively coupled plasma (ICP) inside the substrate processing chamber.

Example 21. The system of one of examples 13 to 20, further including an electron beam ionizer coupled to the process chamber, where the electron beam ionizer is configured to direct a beam of energetic electrons to intercept the flux of gas clusters in the process chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for processing a substrate, the system comprising:
   a first subsystem comprising:
      a plenum comprising a first gas inlet;
      a nozzle assembly comprising a plurality of nozzles, wherein an intake aperture of each of the plurality of nozzles is disposed inside the plenum, and wherein a first nozzle of the plurality of nozzles is a polarizing nozzle, the polarizing nozzle further comprising a dielectric matrix embedded with two conductive layers electrically insulated by the dielectric matrix, wherein the two conductive layers are configured to be electrically coupled to a pulsed DC bias source; and
      a gas cluster process chamber connected to the plenum through the plurality of nozzles of the nozzle assembly, the gas cluster process chamber being coupled with a second gas inlet, the second gas inlet being below the nozzle assembly; and
      a gas flow system connected to the first gas inlet, the second gas inlet, and a gas outlet of the gas cluster process chamber, wherein the gas flow system is configured to generate a flux of gas clusters in the gas cluster process chamber and to introduce a gaseous mixture through the second gas inlet; and a second subsystem comprising:
  a power source for powering a plasma from the gaseous mixture in the gas cluster process chamber.

2. The system of claim 1, wherein an exit aperture of each of the plurality of nozzles is disposed outside the plenum, wherein each of the plurality of nozzles is shaped like a tube, a truncated cone, a funnel having a stem coupled to the plenum, or a convergent-divergent de Laval nozzle.

3. The system of claim 1, wherein each nozzle of the nozzle assembly has:
  a length greater than or equal to 1 cm and less than or equal to 10 cm;
  a throat width greater than or equal to 0.5 mm and less than or equal to 1 mm; and
  an expansion ratio greater than or equal to 1 and less than or equal to 10.

4. The system of claim 1, wherein the first subsystem further comprises a cooling system coupled to the plenum, wherein the cooling system is configured to control the temperature of the gas in the plenum at a target value greater than or equal to 100 K and less than or equal to 310 K.

5. The system of claim 1, wherein the gaseous mixture comprises tetrafluoromethane, hexafluorocyclobutene, octafluorocyclobutane, nitrogen trifluoride, oxygen, argon, or helium.

6. A system for processing a substrate, the system comprising:
  a first subsystem comprising:
    a plenum comprising a gas inlet;
    a nozzle assembly comprising a plurality of nozzles and a first nozzle disposed adjacent the plurality of nozzles, the first nozzle being a polarizing nozzle, the polarizing nozzle further comprising a dielectric matrix embedded with two conductive layers electrically insulated by the dielectric matrix, wherein the two conductive layers are configured to be electrically coupled to a pulsed DC bias source, a respective intake aperture of the first nozzle and respective intake apertures of each of the plurality of nozzles being disposed inside the plenum; and
    a gas cluster process chamber connected to the plenum through the plurality of nozzles of the nozzle assembly; and
  a gas flow system connected to the gas inlet and a gas outlet of the gas cluster process chamber, the gas flow system being configured to generate a flux of gas clusters in the gas cluster process chamber; and
  a second subsystem comprising:
    a substrate processing chamber disposed outside the plenum and configured to sustain a plasma, the first nozzle having an exit aperture coupled to the substrate processing chamber; and
    a power source for powering a plasma in the substrate processing chamber.

7. The system of claim 6, wherein the first nozzle has an expansion ratio greater than or equal to unity, and wherein the first nozzle is shaped like a tube, a truncated cone, a funnel having a stem coupled to the plenum, or a convergent-divergent de Laval nozzle.

8. The system of claim 6, further comprising a cooling system coupled to the plenum, wherein the cooling system is configured to control the temperature of a gas in the plenum at a target value greater than or equal to 100 K and less than or equal to 310 K.

9. The system of claim 6, wherein the substrate processing chamber comprises a second gas inlet and a substrate holder, and wherein the gas flow system is further connected to the second gas inlet and the gas outlet.

10. The system of claim 9, wherein the substrate holder is coupled to a pulsed DC bias source or a radio frequency (RF) bias power source.

11. The system of claim 9, further comprising an electrode coupled to a radio frequency (RF) power source, wherein the electrode is shaped like a coil disposed outside the substrate processing chamber, and wherein the electrode is configured to sustain inductively coupled plasma (ICP) inside the substrate processing chamber.

12. The system of claim 9, further comprising an electron beam ionizer coupled to the substrate processing chamber, wherein the electron beam ionizer is configured to direct a beam of energetic electrons to intercept the flux of gas clusters in the substrate processing chamber.

13. A system for processing a substrate, the system comprising:
  a first subsystem comprising:
    a plenum comprising a gas inlet;
    a nozzle assembly comprising a plurality of nozzles, a first nozzle of the plurality of nozzles being a polarizing nozzle, the polarizing nozzle further comprising a dielectric matrix embedded with two conductive layers electrically insulated by the dielectric matrix, wherein the two conductive layers are configured to be electrically coupled to a pulsed DC bias source, an intake aperture of each of the plurality of nozzles being disposed inside the plenum; and
    a gas cluster process chamber connected to the plenum through the plurality of nozzles of the nozzle assembly; and
  a gas flow system connected to the gas inlet and a gas outlet of the gas cluster process chamber, wherein the gas flow system is configured to:
    generate a flux of gas clusters in the gas cluster process chamber, the gas clusters comprising radical precursors; and
    expose a substrate disposed in the gas cluster process chamber to the flux of gas clusters; and
  a second subsystem comprising:
    a plasma process chamber; and
    a power source for powering a plasma in the plasma process chamber, the plasma comprising ions, the plasma process chamber being configured to expose the substrate to the ions.

14. The system of claim 13, wherein generating the flux of gas clusters and exposing the substrate to the flux of gas clusters comprises:
  loading the substrate into the gas cluster process chamber;
  introducing a gas under pressure into the plenum through the gas inlet of the plenum; and
  flowing the gas from the plenum to the gas cluster process chamber through a nozzle of the plurality of nozzles, the nozzle having an expansion ratio greater than or equal to unity.

15. The system of claim 14, wherein the flowing the gas comprises applying a gas pressure less than or equal to 760 Torr in the plenum.

16. The system of claim 14, wherein the flowing the gas cools the gas to form a gas cluster condensate in the gas cluster process chamber.

17. The system of claim 13, wherein the gas cluster process chamber and the plasma process chamber are integrated as part of a combined gas cluster and plasma process chamber.

18. The system of claim 13, wherein the first nozzle of the plurality of nozzles is shaped like a tube.

19. The system of claim 13, wherein the first nozzle of the plurality of nozzles is shaped like a truncated cone.

20. The system of claim 13, wherein the first nozzle of the plurality of nozzles is shaped like a funnel having a stem coupled to the plenum.

21. The system of claim 13, wherein the first nozzle of the plurality of nozzles is shaped like a convergent-divergent de Laval nozzle.

* * * * *